(12) United States Patent
Jung et al.

(10) Patent No.: US 10,811,294 B2
(45) Date of Patent: Oct. 20, 2020

(54) SUBSTRATE TRANSFER APPARATUS AND CONTROL METHOD THEREOF

(71) Applicant: WONIK IPS CO., LTD., Pyeongtaek-si, Gyeonggi-do (KR)

(72) Inventors: Hyun Soo Jung, Osan-si (KR); Yong Baek Jeon, Anyang-si (KR)

(73) Assignee: WONIK IPS CO., LTD., Pyeongtaek-si, Gyeonggi-do (KR)

( * ) Notice: Subject to any disclaimer, the term of this patent is extended or adjusted under 35 U.S.C. 154(b) by 259 days.

(21) Appl. No.: 15/709,496

(22) Filed: Sep. 20, 2017

(65) Prior Publication Data

US 2018/0082879 A1   Mar. 22, 2018

(30) Foreign Application Priority Data

Sep. 20, 2016   (KR) .................. 10-2016-0120177

(51) Int. Cl.
*H01L 21/67*   (2006.01)
*H01L 21/677*   (2006.01)
*H01L 21/673*   (2006.01)

(52) U.S. Cl.
CPC .. *H01L 21/67766* (2013.01); *H01L 21/67259* (2013.01); *H01L 21/67288* (2013.01); *H01L 21/67303* (2013.01); *H01L 21/67742* (2013.01)

(58) Field of Classification Search
None
See application file for complete search history.

(56) References Cited

U.S. PATENT DOCUMENTS

| | | | | |
|---|---|---|---|---|
| 4,259,019 A | * | 3/1981 | Johannsmeier | G03F 9/70 250/559.3 |
| 4,819,167 A | * | 4/1989 | Cheng | H01L 21/681 250/442.11 |
| 4,853,880 A | * | 8/1989 | Akamatsu | G03F 7/7075 700/302 |
| 4,929,893 A | * | 5/1990 | Sato | G01R 31/2886 324/750.19 |

(Continued)

FOREIGN PATENT DOCUMENTS

KR   1020090105819 A   10/2009
TW   200717693 A   5/2007

(Continued)

*Primary Examiner* — Bhavesh V Amin
(74) *Attorney, Agent, or Firm* — William Park & Associates Ltd.

(57) ABSTRACT

Provided are a substrate transfer apparatus and a control method thereof. The substrate transfer apparatus includes a body having a gate through which a substrate passes; a substrate transfer robot provided inside the body and including an end effector that includes a first seating portion and a second seating portion horizontally spaced apart from each other; a sensing portion including a light emitting portion and a light receiving portion spaced apart from each other in a diagonal direction with respect to a longitudinal direction of the first and second seating portions with reference to the end effector, and detecting the position of at least one of the first seating portion and the second seating portion when the end effector moves; and a control unit for determining whether the end effector is misaligned or sagged by using a measured value measured by the sensing portion and a predetermined reference value.

5 Claims, 10 Drawing Sheets

(56) References Cited

U.S. PATENT DOCUMENTS

| | | | | |
|---|---|---|---|---|
| 5,151,008 A * | 9/1992 | Ishida | B25J 9/0084 | 414/744.5 |
| 5,194,743 A * | 3/1993 | Aoyama | G03F 7/70716 | 250/548 |
| 5,314,294 A * | 5/1994 | Taniguchi | B65G 47/907 | 414/744.5 |
| 5,404,894 A * | 4/1995 | Shiraiwa | H01L 21/67167 | 118/500 |
| 5,504,345 A * | 4/1996 | Bartunek | H01L 21/67778 | 250/559.4 |
| 5,697,748 A * | 12/1997 | Somekh | H01L 21/67748 | 414/217 |
| 5,783,834 A * | 7/1998 | Shatas | H01L 21/67778 | 250/559.33 |
| 5,980,194 A * | 11/1999 | Freerks | H01L 21/67259 | 414/754 |
| 5,980,195 A * | 11/1999 | Miyashita | H01L 21/6732 | 414/783 |
| 6,048,162 A * | 4/2000 | Moslehi | H01L 21/67754 | 414/744.6 |
| 6,164,894 A * | 12/2000 | Cheng | G01R 31/2831 | 414/222.01 |
| 6,167,322 A * | 12/2000 | Holbrooks | H01L 21/68707 | 700/112 |
| 6,283,355 B1 * | 9/2001 | Ma | H01L 21/68707 | 228/44.3 |
| 6,293,746 B1 * | 9/2001 | Ogawa | B25J 9/042 | 414/744.4 |
| 6,298,280 B1 * | 10/2001 | Bonora | H01L 21/681 | 414/941 |
| 6,425,280 B1 * | 7/2002 | Ames | G03F 7/7075 | 33/645 |
| 6,631,935 B1 * | 10/2003 | Casarotti | H01L 21/67259 | 294/185 |
| 6,671,576 B1 * | 12/2003 | Chen | H01L 21/67259 | 414/937 |
| 6,728,596 B1 * | 4/2004 | Lindseth | H01L 21/681 | 382/151 |
| 6,813,543 B2 * | 11/2004 | Aalund | H01L 21/67265 | 414/416.09 |
| 6,825,486 B1 * | 11/2004 | Cole | G06T 5/009 | 250/205 |
| 6,837,672 B1 * | 1/2005 | Tateyama | H01L 21/67742 | 414/815 |
| 6,915,183 B2 * | 7/2005 | Iida | H01L 21/6715 | 414/939 |
| 6,935,830 B2 * | 8/2005 | Berger | H01L 21/68 | 294/188 |
| 6,962,477 B2 * | 11/2005 | Tateyama | H01L 21/67742 | 414/815 |
| 7,043,335 B2 * | 5/2006 | Yoshida | H01L 21/67265 | 359/470 |
| 7,054,713 B2 * | 5/2006 | Teng | H01L 21/67265 | 414/416.08 |
| 7,095,763 B2 * | 8/2006 | Schuda | H01L 21/67265 | 250/559.4 |
| 7,235,806 B2 * | 6/2007 | Beginski | H01L 21/67259 | 250/221 |
| 7,690,881 B2 * | 4/2010 | Yamagishi | H01L 21/67201 | 414/744.2 |
| 7,706,919 B2 * | 4/2010 | Adachi | H01L 21/68707 | 700/254 |
| 8,215,890 B2 * | 7/2012 | Tseng | H01L 21/681 | 414/274 |
| 9,196,518 B1 * | 11/2015 | Hofmeister | H01L 21/677 | |
| 2003/0071198 A1 * | 4/2003 | Kesil | H01L 21/68707 | 250/221 |
| 2003/0085368 A1 * | 5/2003 | Kesil | G01V 8/12 | 250/559.36 |
| 2004/0012363 A1 * | 1/2004 | Simondet | B25J 9/1692 | 318/568.21 |
| 2004/0068347 A1 | 4/2004 | Aalund et al. | | |
| 2004/0151574 A1 * | 8/2004 | Lu | H01L 21/681 | 414/816 |
| 2005/0021177 A1 * | 1/2005 | Bacchi | B25J 19/025 | 700/245 |
| 2006/0112405 A1 * | 5/2006 | Okazawa | G11B 23/0308 | 720/738 |
| 2009/0093906 A1 * | 4/2009 | Takizawa | H01L 21/67265 | 700/214 |
| 2009/0095886 A1 * | 4/2009 | van der Meulen | H01L 21/67265 | 250/214 R |
| 2009/0252580 A1 * | 10/2009 | Takizawa | H01L 21/68707 | 414/222.02 |
| 2013/0177857 A1 * | 7/2013 | Shibazaki | G03F 7/7075 | 430/325 |
| 2013/0183623 A1 * | 7/2013 | Shibazaki | G03F 7/70725 | 430/296 |
| 2017/0011210 A1 * | 1/2017 | Cheong | G06F 21/32 | |
| 2018/0082879 A1 * | 3/2018 | Jung | H01L 21/67766 | |
| 2019/0200977 A1 * | 7/2019 | Shelton, IV | A61B 17/02 | |
| 2019/0206565 A1 * | 7/2019 | Shelton, IV | A61B 34/74 | |
| 2020/0100830 A1 * | 4/2020 | Henderson | G16H 40/67 | |

FOREIGN PATENT DOCUMENTS

| | | |
|---|---|---|
| TW | I336212 B | 1/2011 |
| TW | 201444655 A | 12/2014 |
| TW | 201515976 A | 5/2015 |
| TW | I559584 B | 11/2016 |

* cited by examiner

SUBSTRATE TRANSFER APPARATUS AND CONTROL METHOD THEREOF

CROSS-REFERENCE TO RELATED APPLICATIONS

This application claims priority to and the benefit of Korean Patent Application No. 10-2016-0120177 filed in the Korean Intellectual Property Office on Sep. 20, 2016, the entire contents of which are incorporated herein by reference.

BACKGROUND

Field

The present invention relates to a substrate transfer apparatus and a control method thereof, and more particularly, to a substrate transfer apparatus and a control method of the substrate transfer apparatus capable of detecting the sagging and misalignment of an end effector that accommodates a substrate when the substrate is loaded by a substrate transfer robot into a process chamber.

Related Technology

In general, a semiconductor manufacturing process repeatedly performs unit operations such as a thin film deposition process, an etching process, a polishing process, and a cleaning process to form a semiconductor device having desired circuit operation characteristics. Various semiconductor manufacturing equipment such as etching equipment, chemical vapor deposition equipment, sputtering equipment, and chemical mechanical polishing equipment are used to carry out the respective unit operations. In such various semiconductor manufacturing equipment, a substrate transfer robot is used to load a substrate into a process chamber or to discharge a substrate that has undergone the unit operations from the process chamber.

However, when the substrate transfer robot lifts and transfers the substrate to the process chamber, the substrate transfer robot may experience deterioration, vibrations or abrasion such that errors occur in the end effector that receives the substrate. Due to such errors in the end effector, the substrate may not be seated in the correct position on the process stage in the process chamber.

Therefore, when there is an error in the position of the substrate lifted by the end effector of the substrate transfer robot while the substrate is transferred by the substrate transfer robot to the process chamber, the error causes a problem that the center of the substrate cannot be accurately positioned on the center of the process stage in the process chamber.

SUMMARY

The present invention has been made to solve various problems including the above-mentioned ones, and it is an object of the present invention to provide an abnormality sensing device for a substrate transfer robot that is capable of detecting the sagging and misalignment of an end effector that accommodates a substrate when the substrate is loaded by the substrate transfer robot into a process chamber, and an abnormality sensing method for a substrate transfer robot. However, these problems are illustrative, and thus the scope of the present invention is not limited thereto.

According to an aspect of the present invention, there is provided a substrate transfer apparatus. The substrate transfer apparatus includes: a body in which a space is defined and having a gate through which a substrate passes; a substrate transfer robot provided inside the body and including an end effector that includes a first seating portion and a second seating portion horizontally spaced apart from each other to support and transfer the substrate; at least one sensing portion including a light emitting portion and a light receiving portion spaced apart from each other in a diagonal direction with respect to a longitudinal direction of the first seating portion and the second seating portion with reference to the end effector, and detecting the position of at least one of the first seating portion and the second seating portion when the end effector moves; and a control unit for determining whether the end effector is misaligned or sagged by using a measured value measured by the sensing portion and a predetermined reference value.

The sensing portion may include a first sensing portion including a first light emitting portion and a first light receiving portion disposed at positions corresponding to front end portions of the first seating portion and the second seating portion in a diagonal direction with respect to a reference position of the substrate transfer robot, and a second sensing portion including a second light emitting portion and a second light receiving portion disposed at positions corresponding to rear end portions of the first seating portion and the second seating portion so as to be parallel to the first sensing portion in a diagonal direction with respect to the reference position of the substrate transfer robot.

The control unit may compare a first sensing signal sensed by the first sensing portion and a second sensing signal sensed by the second sensing portion with the reference value, and output an abnormality signal if the first and second sensing signals fall outside a normal range of the reference value.

When the end effector moves up and down at the reference position, the control unit may measure the ON/OFF times of the first sensing signal and the second sensing signal and calculate a moving time, calculate a moving distance traveled by the end effector by using the moving time and rotation pulse values of a driving motor for driving the substrate transfer robot, and compare the moving time and the moving distance with the reference value, thereby determining whether the first seating portion or the second seating portion is sagging and the amount of sagging.

When the end effector rotates at the reference position, the control unit may measure the ON/OFF times of the first sensing signal and the second sensing signal and calculate a moving time, calculate a moving distance traveled by the end effector by using the moving time and rotation pulse values of a driving motor for driving the substrate transfer robot, and compare the moving time and the moving distance with the reference value, thereby determining whether the end effector is misaligned along a rotational direction and the amount of misalignment.

According to an aspect of the present invention, there is provided a control method of a substrate transfer apparatus. The control method may comprise the steps of: sensing in which a measurement value is received from the sensing portion when the end effector moves, and determining in which the sagging or misalignment of the end effector is determined by the control unit by using the measured value by the sensing portion and the reference values.

In the control method, the step of sensing may further comprise the steps of: sensing a first sensing signal; and sensing a second sensing signal, wherein, in the step of sensing a first sensing signal, the first sensing signal is received from a first sensing portion, and the first sensing portion includes a first light emitting portion and a first light receiving portion disposed at positions corresponding to front end portions of the first seating portion and the second seating portion in a diagonal direction with respect to a reference position of the substrate transfer robot, and wherein, in the step of sensing a second sensing signal, the second sensing signal is received from a second sensing portion, and the second sensing portion includes a second light emitting portion and a second light receiving portion disposed at positions corresponding to rear end portions of the first seating portion and the second seating portion so as to be parallel to the first sensing portion in a diagonal direction with respect to the reference position of the substrate transfer robot.

In the control method, in the step of determining, the control unit may compare the first sensing signal sensed by the first sensing portion and the second sensing signal sensed by the second sensing portion with the reference value, and output an abnormality signal if the first and second sensing signals fall outside a normal range of the reference value.

In the control method, in the step of determining, the control unit may measure the ON/OFF time of the first sensing signal and the ON/OFF time of the second sensing signal and calculate a moving time, calculate a moving distance traveled up and down by the end effector by using the moving time and rotation pulse values of a driving motor for driving the substrate transfer robot, and compare the moving time and the moving distance with the reference value, thereby determining whether the first seating portion or the second seating portion of the end effector is sagging and the amount of sagging.

In the control method, in the step of determining, the control unit may measure the ON/OFF time of the first sensing signal and the ON/OFF time of the second sensing signal and calculate a moving time, calculate a moving distance traveled rotationally by the end effector by using the moving time and rotation pulse values of a driving motor for driving the robot R, and compare the moving time and the moving distance with the reference value, thereby determining whether the end effector is misaligned along a rotational direction and the amount of misalignment.

According to an embodiment of the present invention as described above, a plurality of sensing portions, each including a light emitting portion and a light receiving portion, are disposed on the upper or lower side of the end effector, and each of the light emitting portions and the light receiving portions are disposed at different heights, such that is it possible to detect whether the end effector is sagged in a vertical direction and misaligned in a rotational direction, respectively.

Furthermore, according to an embodiment of the present invention as described above, by sensing in real time the sagging in a vertical direction and the misalignment in a rotational direction of the end effector at the same time, it is possible to monitor the sagging and misalignment of the end effector without affecting the productivity of the semiconductor manufacturing equipment even if the maintenance cycle of the semiconductor manufacturing equipment does not arrive. Of course, the scope of the present invention is not limited by these effects.

DETAILED DESCRIPTION

Figure 1:
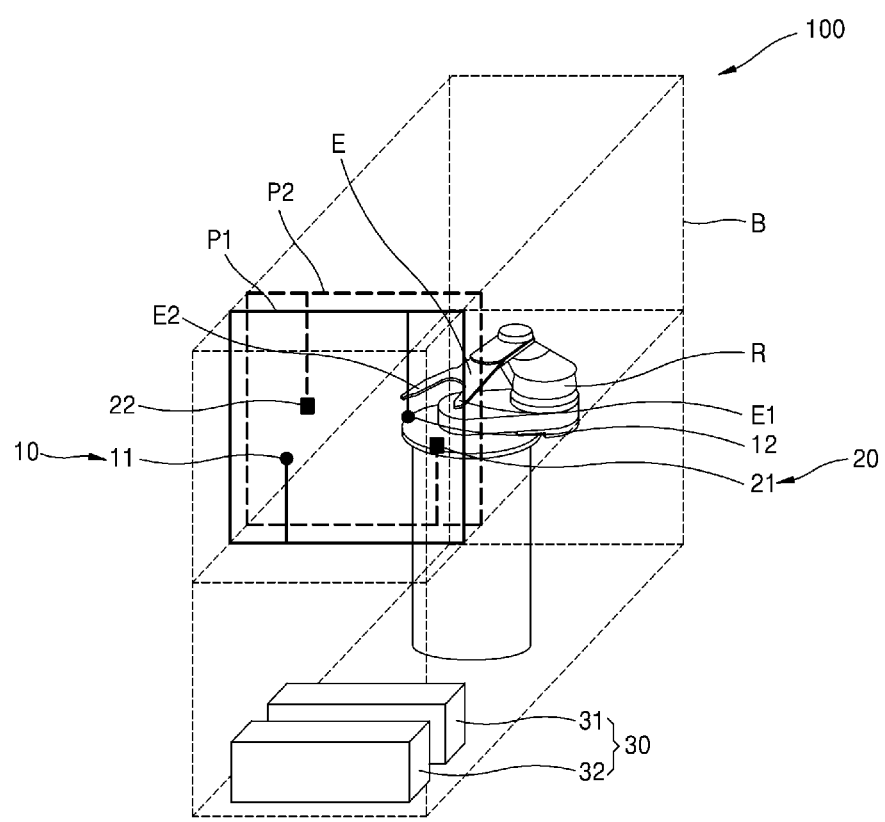
FIG. 1 is a perspective view illustrating a substrate transfer apparatus according to an embodiment of the present invention.

Hereinafter, embodiments of the present invention will be described in detail with reference to the accompanying drawings.

The following embodiments are intended to give a more complete description of the present disclosure, and are provided in order to fully convey the scope of the disclosure to those skilled in the art. However, it should be understood that the present invention is not limited to the embodiments described below, but may be embodied in various other forms. Rather, these embodiments are provided so that this disclosure will be more thorough and complete, and will fully convey the scope of the invention to those skilled in the art. Also, the thickness and the size of each layer in the drawings are exaggerated for convenience and clarity of explanation.

Figure 2:
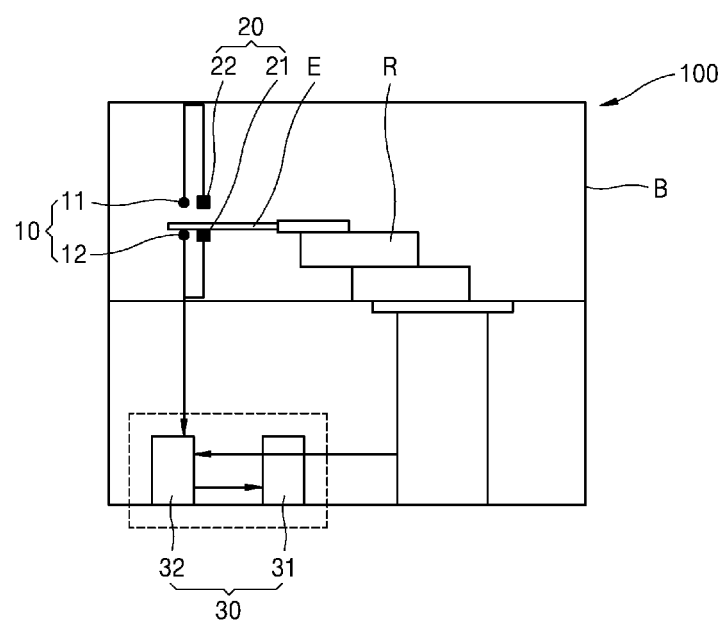
FIG. 2 is a cross-sectional view illustrating the substrate transfer apparatus of FIG. 1.

FIG. 1 is a perspective view illustrating a substrate transfer apparatus 100 according to an embodiment of the present invention. FIG. 2 is a cross-sectional view illustrating the substrate transfer apparatus 100 of FIG. 1.

As shown in FIGS. 1 and 2, a substrate transfer apparatus 100 according to an embodiment of the present invention includes a body B, a substrate transfer robot R, sensing portions 10 and 20, and a control unit 30.

As shown in FIG. 1, a space is defined in the body B, and a gate through which a substrate passes may be provided at one side of the body B. More specifically, the body B is connected to a process chamber such that the substrate transfer robot R can load a substrate into the process chamber via the gate or discharge a substrate that has undergone unit operations from the process chamber.

The substrate transfer robot R is disposed inside the body B and includes an end effector E that includes a first seating portion E1 and a second seating portion E2 which are horizontally spaced apart from each other to support and transfer the substrate.

For example, the end effector E may be configured to move up and down or rotate by the substrate transfer robot R, and may include a first seating portion E1 for supporting one side of a substrate and a second seating portion E2 for supporting the other side of the substrate to accommodate the substrate. The second seating portion E2 may be spaced apart from the first seating portion E1.

More specifically, the end effector E has a structure having a suitable strength and durability in which the first seating portion E1 and the second seating portion E2 are spaced apart from each other and arranged in a U-shape so as to support the substrate. For example, the end effector E may be a structure comprising one or more materials selected from steel, stainless steel, aluminum, magnesium, and zinc. However, the end effector E is not necessarily limited to FIG. 1, and members of various materials capable of supporting the substrate can be applied.

The sensing portions 10 and 20 include a light emitting portion and a light receiving portion which are spaced apart from each other in a diagonal direction inclined with respect to the longitudinal direction of the first seating portion E1 and the second seating portion E2 with reference to the end effector E, and may detect the position of at least one of the first seating portion E1 and the second seating portion E2 when the end effector E moves.

For example, the sensing portions 10 and 20 may be arranged such that the light emitting portion and the light receiving portion are spaced apart from each other in a diagonal direction that is inclined in a direction perpendicular to the longitudinal direction of the first seating portion E1 and the second seating portion E2. The sensing portions 10 and 20 may include a first sensing portion 10 and a second sensing portion 20. The first sensing portion 10 includes a first light emitting portion 11 and a first light receiving portion 12 disposed at positions corresponding to the front end portions of the first seating portion E1 and the second seating portion E2 in a diagonal direction with respect to a reference position of the substrate transfer robot R. The second sensing portion 20 includes a second light emitting portion 21 and a second light receiving portion 22 disposed at positions corresponding to the rear end portions of the first seating portion E1 and the second seating portion E2 so as to be parallel to the first sensing portion 10 in a diagonal direction with respect to the reference position of the substrate transfer robot R.

More specifically, the first sensing portion 10 includes a first light emitting portion 11 and a first light receiving portion 12 that are disposed opposite to each other outside of the end effector E along a first diagonal line connecting the upper outer side of the first seating portion E1 and the lower outer side of the second seating portion E2. The first sensing portion 10 may generate a first sensing signal with the first light emitting portion 11 obliquely irradiating a first illumination light to the first seating portion E1 in a direction of the first diagonal line to detect the first seating portion E1 when the end effector E moves.

For example, the first sensing portion 10 may include a first light emitting portion 11 and a first light receiving portion 12. The first light emitting portion 11 obliquely emits the first illumination light toward one side of the end effector E from above or below the end effector E. The first light receiving portion 12 is disposed above or below the end effector E to face the first light emitting portion 11 in a diagonal direction with respect to the end effector E and receives the first illumination light emitted from the first light emitting portion 11. The first light emitting portion 11 and the first light receiving portion 12 are disposed at different heights along the vertical moving direction of the end effector E such that the first illumination light has a path inclined at a predetermined angle with respect to the end effector E.

Furthermore, the second sensing portion 20 includes a second light emitting portion 21 and a second light receiving portion 22 that are disposed opposite to each other outside of the end effector E along a second diagonal line connecting the upper outer side of the second seating portion E2 and the lower outer side of the first seating portion E1. The second sensing portion 20 may generate a second sensing signal with the second light emitting portion 21 obliquely irradiating a second illumination light to the second seating portion E2 in a direction of the second diagonal line to detect the second seating portion E2 when the end effector E moves.

For example, the second sensing portion 20 may include a second light emitting portion 21 and a second light emitting portion 22. The second light emitting portion 21 obliquely emits the second illumination light toward one side of the end effector E from above or below the end effector E. The second light receiving portion 22 is disposed above or below the end effector E to face the second light emitting portion 21 in a diagonal direction with respect to the end effector E and receives the second illumination light emitted from the second light emitting portion 21. The second light emitting portion 21 and the second light receiving portion 22 are disposed at different heights along the vertical moving direction of the end effector E such that the second illumination light has a path inclined at a predetermined angle with respect to the end effector E.

Here, the first illumination light and the second illumination light may be spaced apart from each other by a predetermined distance along the entry direction of the end effector E, and may be staggered from each other. For example, the first light emitting portion 11 and the first light receiving portion 12 are positioned on a first plane P1 that is in a direction perpendicular to the end effector E, and the second light emitting portion 21 and the second light receiving portion 22 are positioned on a second plane P2 that is in a direction perpendicular to the end effector E, and the first plane P1 and the second plane P2 are parallel to each other and spaced apart from each other by a certain distance.

More specifically, if the first seating portion E1 or the second seating portion E2 of the end effector E is located in the path of the first illumination light between first light emitting portion 11 and the first light receiving portion 12 of the first sensing portion 10, the first illumination light emitted from the first light emitting portion 11 may not be received by the first light receiving portion 12 due to the first seating portion E1 or the second seating portion E2. Here, the first sensing signal of the first sensing portion 10 may be applied in an OFF state to the control unit 30.

On the other hand, if the first seating portion E1 or the second seating portion E2 of the end effector E is not located in the path of the first illumination light between the first light emitting portion 11 and the first light receiving portion 12 of the first sensing portion 10, the first illumination light emitted from the first light emitting portion 11 may be smoothly received by the first light receiving portion 12. Here, the first sensing signal of the first sensing portion 10 may be applied in an ON state to the control unit 30.

In addition, the second sensing portion 20 may have elements having the same configuration and function as those of the first sensing portion 10 described above. Therefore, detailed description thereof will be omitted.

The control unit 30 may determine whether the end effector E is misaligned or sagged by using the measured values measured by the sensing portions 10 and 20 and predetermined reference values. For example, the control unit 30 may compare the first sensing signal sensed by the first sensing portion 10 and the second sensing signal sensed by the second sensing portion 20 with the reference values, and output an abnormality signal if the first and second sensing signals fall outside the normal range of the reference values.

More specifically, the control unit 30 includes a reference signal storage unit 31 and a sensing signal analysis unit 32. The reference signal storage unit 31 stores reference values T1, T2 and T3 that serve as references for the normal state of the end effector E. The sensing signal analysis unit 32 compares the first and second sensing signals with the reference values T1, T2 and T3 and outputs an abnormality signal if the first and second sensing signals fall outside the normal range of the reference values T1, T2 and T3.

For example, after an end effector E that has no sagging and misalignment and therefore is in a normal state is aligned at the reference position, the reference signal storage unit 31 may measure the ON/OFF times of the first sensing signal and the second sensing signal as the end effector moves up and down or rotates and store the measured reference times as reference values T1, T2 and T3. Furthermore, by using at least one of the ON/OFF time of the first sensing signal and the ON/OFF time of the second sensing signal measured during the up and down movement or rotational movement of the end effector E at the reference position when the end effector E is in the normal state, and using the rotation pulse values of a driving motor for driving the robot R, the reference signal storage unit 31 may calculate the distances traveled by the end effector E and store them as reference distances H1, H2, and H3.

With the above arrangement, when the end effector E moves up and down at the reference position, the control unit 30 measures the ON/OFF times of the first sensing signal and the second sensing signal and calculates a moving time, calculates a moving distance traveled by the end effector E using the moving time and the rotation pulse values of a driving motor for driving the substrate transfer robot R, and compares the moving time and the moving distance with the reference values, thereby determining whether the first seating portion E1 or the second seating portion E2 is sagging and the amount of sagging.

Furthermore, when the end effector E rotates at the reference position, the control unit 30 measures the ON/OFF times of the first sensing signal and the second sensing signal and calculates a moving time, calculates a moving distance traveled by the end effector E using the moving time and the rotation pulse values of the driving motor for driving the substrate transfer robot R, and compares the moving time and the moving distance with the reference values, thereby determining whether the end effector is misaligned along a rotational direction and the amount of misalignment.

Accordingly, as shown in FIGS. 1 and 2, the substrate transfer apparatus 100 according to an embodiment of the present invention is capable of sensing in real time whether the end effector E is sagged or misaligned while the substrate transfer robot R operates, and preventing the substrate transfer robot R from malfunctioning, thereby preventing damage to the end effector E or the substrate. Furthermore, by sensing in real time the sagging of the end effector E, the substrate transfer apparatus 100 according to an embodiment of the present invention helps monitor the sagging and misalignment of the end effector E without affecting the productivity of the semiconductor manufacturing equipment even if the maintenance cycle of the semiconductor manufacturing equipment does not arrive.

Figure 3:
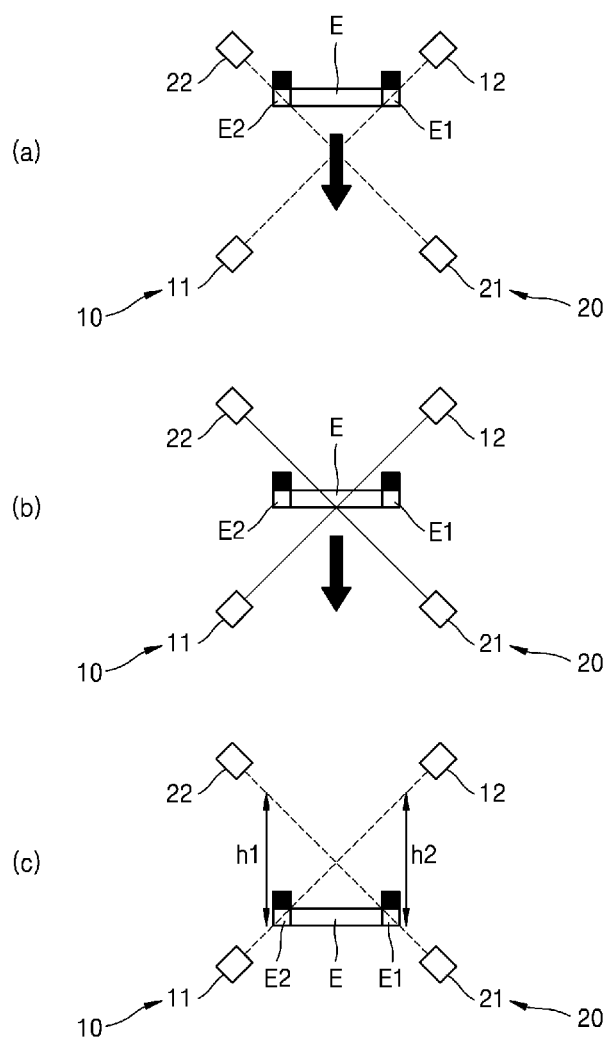
FIG. 3 is a schematic view illustrating a process of detecting the sagging in a vertical direction of an end effector of a substrate transfer apparatus according to an embodiment of the present invention.
Figure 4:
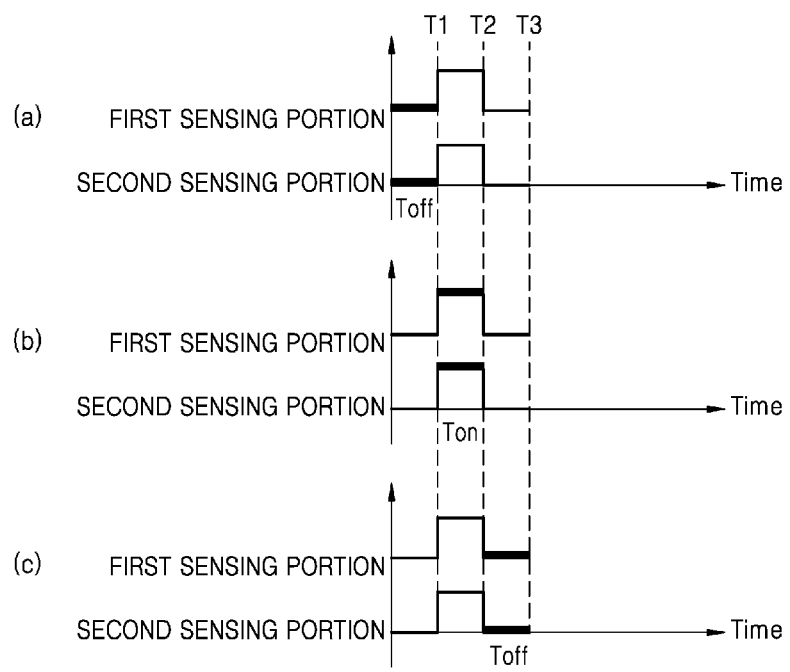
FIG. 4 is a graph illustrating a sensing signal that is input to a control unit in the process of detecting the sagging in a vertical direction of the end effector of the substrate transfer apparatus of FIG. 3.

FIG. 3 is a schematic view illustrating a process of detecting the sagging in a vertical direction of an end effector E of a substrate transfer apparatus 100 according to an embodiment of the present invention. FIG. 4 is a graph illustrating a sensing signal that is input to a control unit 30 in the process of detecting the sagging in a vertical direction of the end effector E of the substrate transfer apparatus 100 of FIG. 3.

As shown in (a) of FIG. 3, when the end effector E is positioned at the reference position and aligned in the correct position such that there is no sagging or misalignment, the first illumination light emitted from the first light emitting portion 11 may not be received by the first light receiving portion 12 due to the first seating portion E1 and the second illumination light emitted from the second light emitting portion 21 may not be received by the second light receiving portion 22 due to the second seating portion E2.

Thus, while the first seating portion E1 and the second seating portion E2 of the end effector E are moving vertically downward in the path of the illumination light of the first sensing portion 10 and the second sensing portion 20, the first sensing signal and the second sensing signal may be in OFF states in the control unit 30, as shown in (a) of FIG. 4. Here, the time during which the first sensing signal and the second sensing signal are in OFF states can be stored as a first reference value T1.

Then, as shown in (b) of FIG. 3, when the end effector E moves further downward such that the first seating portion E1 and the second seating portion E2 of the end effector E moves out of the path of the illumination light of the first sensing portion 10 and the second sensing portion 20, the first sensing signal and the second sensing signal may be in ON states in the control unit 30, as shown in (b) of FIG. 4. Here, the time during which the first sensing signal and the second sensing signal are in ON states can be stored as a second reference value T2.

Then, as shown in (c) of FIG. 3, the end effector moves further downward such that the second illumination light emitted from the second light emitting portion 21 may not be received by the second receiving portion 22 due to the first seating portion E1 and the first illumination light emitted from the first light emitting portion 11 may not be received by the first light receiving portion 12 due to the second seating portion E2. Accordingly, as shown in (c) of FIG. 4, the first sensing signal and the second sensing signal may be in OFF states. Here, the time during which the first sensing signal and the second sensing signal are in OFF states can be stored as a third reference value T3. Here, the reference distances H1 and H2 traveled vertically downward by the end effector E can be calculated by using the respective reference values T1, T2 and T3 and the rotation pulse value of the driving motor for driving the substrate transfer robot R.

Furthermore, the first sensing portion 10 and the second sensing portion 20 may be arranged such that the first illumination light emitted from the first sensing portion 10 and the second illumination light emitted from the second sensing portion 20 are staggered on the movement path of the end effector E, in order to sense the first seating portion E1 or the second seating portion E2 of the end effector E. Here, the first light emitting portion 11 of the first sensing portion 10 and the second light emitting portion 21 of the second sensing portion 20 may be disposed opposite to each other with the end effector E therebetween on the path along which the end effector E moves vertically such that the first illumination light and the second illumination light are staggered from each other.

In order to detect the sagging in a vertical direction of the end effector E, the first illumination light emitted from the first sensing portion 10 and the second illumination light emitted from the second sensing portion 20 may pass through the movement path along which the end effector E moves vertically such that the first sensing portion 10 and the second sensing portion 20 accurately detect the first seating portion E1 and the second seating portion E2 while the end effector moves vertically downward.

Therefore, as shown in FIGS. 3 and 4, according to an abnormality sensing device for the substrate transfer robot according to an embodiment of the present invention, the end effector E is positioned at a reference position and then aligned in the correct position such that there is no sagging or misalignment. Then, while the end effector moves vertically downward, the first sensing portion 10 and the second sensing portion 20 are provided such that the light emitting portions 11 and 21 and the light receiving portions 12 and 22 are disposed at different heights so as to intersect with each other on the path along which the end effector E moves vertically. Thus, it is possible to measure the ON/OFF states of the first and second sensing signals that are applied to the control unit 30.

Therefore, by using the ON/OFF states of the first sensing signal and the second sensing signal applied to the control unit 30, the reference values T1, T2, and T3 and the reference distances H1 and H2, which serve as references for determining whether the end effector E is sagged during the vertical movement of the end effector E, can be accurately measured and stored in the reference signal storage unit 31.

Figure 5:
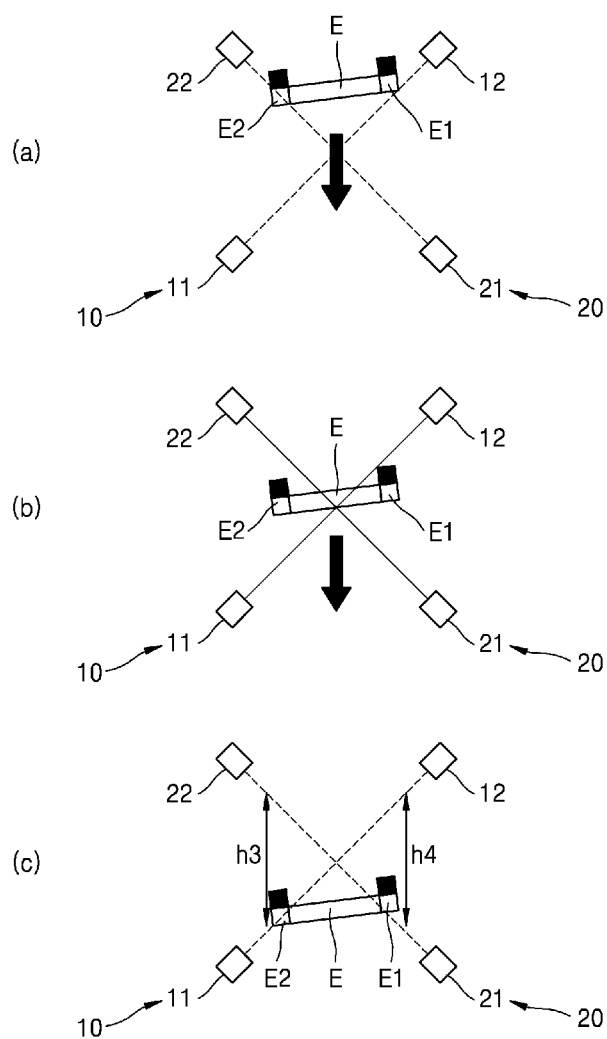
FIG. 5 is a schematic view illustrating a process of detecting the sagging in a vertical direction of an end effector of a substrate transfer apparatus according to another embodiment of the present invention.
Figure 6:
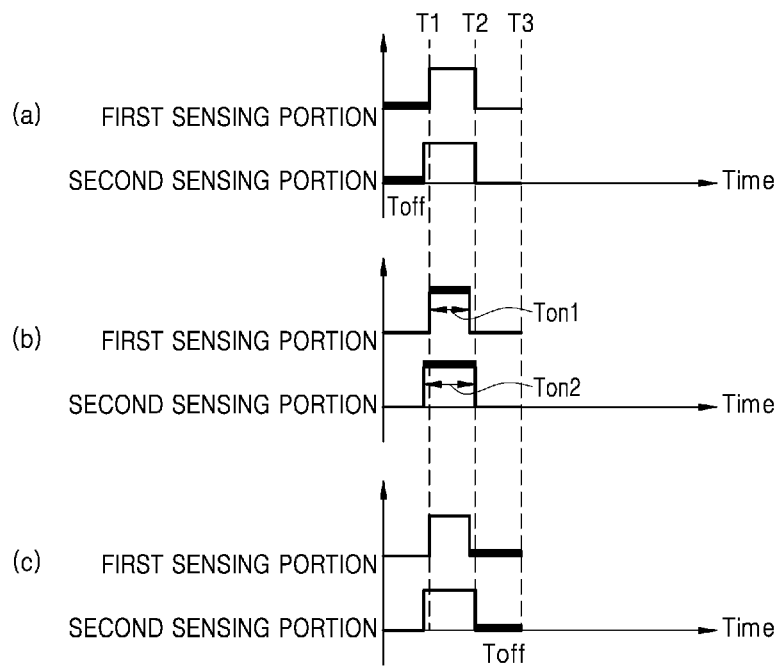
FIG. 6 is a graph illustrating a sensing signal that is input to a control unit in the process of detecting the sagging in a vertical direction of the end effector of the substrate transfer apparatus of FIG. 5.

FIG. 5 is a schematic view illustrating a process of detecting the sagging in a vertical direction of an end effector of a substrate transfer apparatus according to another embodiment of the present invention. FIG. 6 is a graph illustrating a sensing signal that is input to a control unit in the process of detecting the sagging in a vertical direction of the end effector of the substrate transfer apparatus of FIG. 5.

As shown in (a) of FIG. 5, if sagging of the second seating portion E2 of the end effector E occurs, when the end effector E moves vertically downward from the reference position, the first and second sensing signals may be applied to the control unit 30 while the OFF state of the first sensing signal is identical to the first reference value T1 and the OFF state of the second sensing signal is shorter than the first reference value T1, as shown in (a) of FIG. 6. Meanwhile, the ON state of the first sensing signal may be shorter than the second reference value T2 and the ON state of the second sensing signal may be identical to the second reference value T2, as shown in (b) of FIG. 6. Accordingly, as shown in (c) of FIG. 6, the OFF state of the first sensing signal may be maintained longer than the normal value up to the third reference value T3, and the OFF state of the second sensing signal is maintained to be the same as the normal value. On the other hand, if sagging of the first seating portion E1 of the end effector occurs, the ON/OFF states of the first sensing signal and the second sensing signal may have patterns opposite to the above described ON/OFF states of the first sensing signal and the second sensing signal and be applied to the control unit 30.

Therefore, as shown in FIGS. 5 and 6, according to an abnormality sensing device for the substrate transfer robot according to another embodiment of the present invention, when the end effector E moves vertically downward from the reference position, it is possible to accurately determine whether the first seating portion E1 or the second seating portion E2 of the end effector E is sagged and the amount of sagging by using the ON/OFF patterns of the first sensing signal and the second sensing signal applied to the control unit 30.

Therefore, it is possible to accurately sense in real time whether the first seating portion E1 or the second seating portion E2 of the end effector E is sagged and the amount of sagging while the substrate transfer apparatus operates, and to prevent the substrate transfer apparatus from malfunctioning, thereby preventing damage to the end effector E or the substrate. Furthermore, by sensing in real time the sagging of the end effector E, it is possible to monitor the sagging and misalignment of the end effector E without affecting the productivity of the semiconductor manufacturing equipment even if the maintenance cycle of the semiconductor manufacturing equipment does not arrive.

Figure 7:
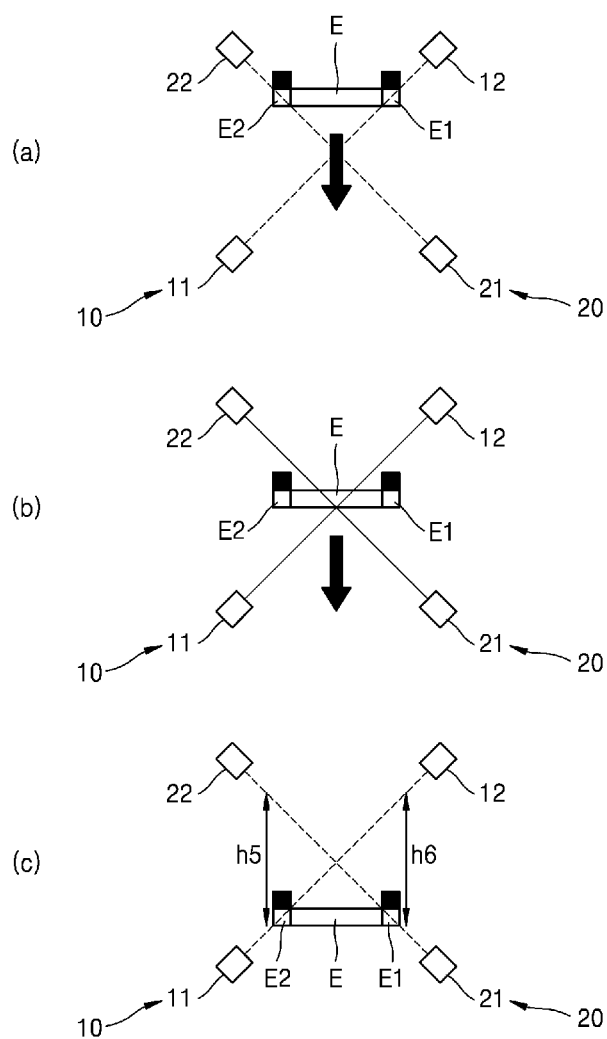
FIG. 7 is a schematic view illustrating a process of detecting the sagging in a vertical direction of an end effector of a substrate transfer apparatus according to yet another embodiment of the present invention.
Figure 8:
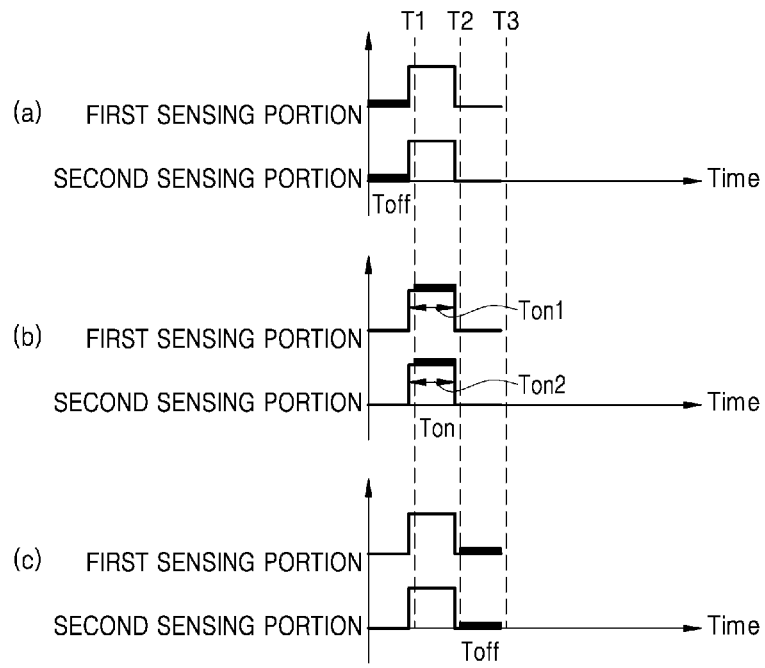
FIG. 8 is a graph illustrating a sensing signal that is input to a control unit in the process of detecting the sagging in a vertical direction of the end effector of the substrate transfer apparatus of FIG. 7.

FIG. 7 is a schematic view illustrating a process of detecting the sagging in a vertical direction of an end effector of a substrate transfer apparatus according to yet another embodiment of the present invention. FIG. 8 is a graph illustrating a sensing signal that is input to a control unit in the process of detecting the sagging in a vertical direction of the end effector of the substrate transfer apparatus of FIG. 7.

As shown in (a) of FIG. 7, if sagging of the first seating portion E1 and the second seating portion E2 of the end effector E occurs at the same time, when the end effector E movers vertically downward from the reference position, the first and second sensing signals may be applied to the control unit 30 while the OFF states of the first and second sensing signals are shorter than the first reference value T1. Meanwhile, as shown in (b) of FIG. 8, the ON states of the first and second sensing signals may be shorter than the second reference value T2. Accordingly, as shown in (c) of FIG. 8, the OFF states of the first sensing signal and the second sensing signal may be maintained longer than the normal value up to the third reference value T3.

Therefore, as shown in FIGS. 7 and 8, according to an abnormality sensing device for the substrate transfer robot according to yet another embodiment of the present invention, when the end effector E moves vertically downward from the reference position, it is possible to accurately determine whether the first seating portion E1 and the second seating portion E2 of the end effector E is sagged at the same time and the amount of sagging by using the ON/OFF patterns of the first sensing signal and the second sensing signal applied to the control unit 30.

Therefore, it is possible to accurately sense in real time whether the first seating portion E1 and the second seating portion E2 of the end effector is sagged at the same time and the amount of sagging while the substrate transfer robot R operates, and to prevent the substrate transfer robot R from malfunctioning, thereby preventing damage to the end effector E or the substrate. Furthermore, by sensing in real time the sagging of the end effector E, it is possible to monitor the sagging and misalignment of the end effector E without affecting the productivity of the semiconductor manufacturing equipment even if the maintenance cycle of the semiconductor manufacturing equipment does not arrive.

Figure 9:
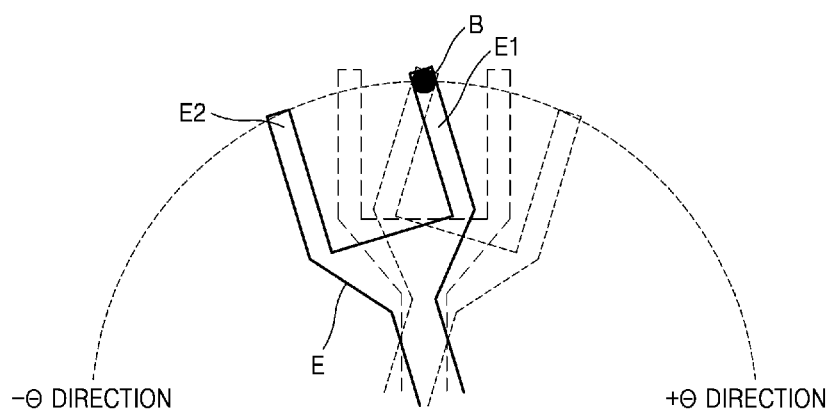
FIG. 9 is a schematic view illustrating a process of detecting the misalignment in a rotational direction of an end effector of a substrate transfer apparatus according to an embodiment of the present invention.
Figure 10:
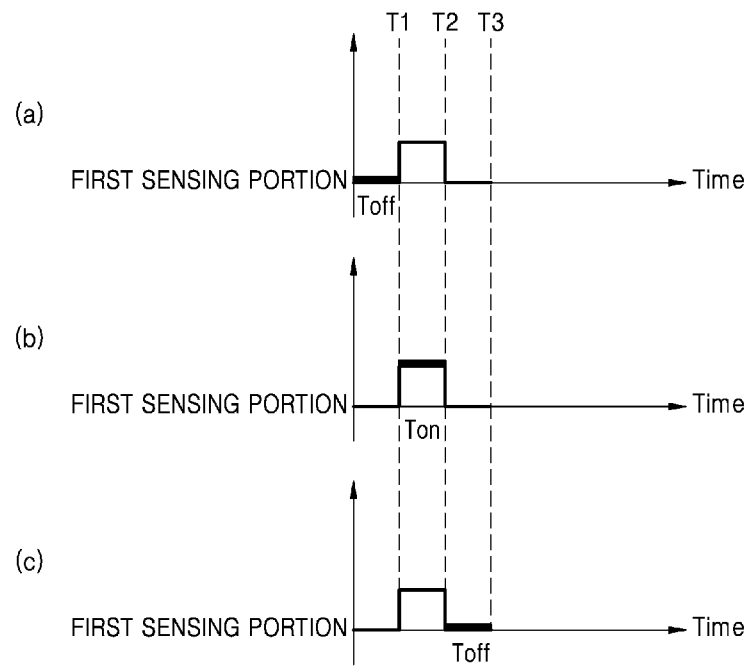
FIG. 10 is a graph illustrating a sensing signal that is input to a control unit in the process of detecting misalignment in the rotational direction of the end effector of the substrate transfer apparatus of FIG. 9.

FIG. 9 is a schematic view illustrating a process of detecting the misalignment in a rotational direction of an end effector of a substrate transfer apparatus according to an embodiment of the present invention. FIG. 10 is a graph illustrating a sensing signal that is input to a control unit in the process of detecting misalignment in the rotational direction of the end effector of the substrate transfer apparatus of FIG. 9.

As shown in FIG. 9, when the end effector E is positioned at the reference position and aligned in the correct position such that there is no sagging and misalignment, the first illumination light B emitted from the first light emitting portion 11 may not be received by the first light receiving portion 12 due to the first seating portion E1. Thus, while the first seating portion E1 of the end effector E is moving rotationally in the path of the first illumination light B of the first sensing portion 10, the first sensing signal may be in an OFF state in the control unit 30, as shown in (a) of FIG. 10. Here, the time during which the first sensing signal is in the OFF state can be stored as a first reference value T1.

Then, as shown in FIG. 9, the end effector E further rotates, and from the moment the first seating portion E1 moves out of the path of the first illumination light B of the first sensing portion 10 until the second seating portion E2 moves into the path of the first illumination light B of the first sensing portion 10, the first sensing signal may be in an ON state in the control unit 30, as shown in (b) of FIG. 10. Here, the time during which the first sensing signal is in the ON state can be stored as a second reference value T2.

Then, as shown in FIG. 9, the end effector further rotates such that the first illumination light B emitted from the first light emitting portion 11 may not be received by the first receiving portion 12 due to the second seating portion E2. Accordingly, as shown in (c) of FIG. 10, the first sensing signal may be in an OFF state. Here, the time during which the first sensing signal is in the OFF state can be stored as a third reference value T3. Here, a reference distance traveled rotationally by the end effector E can be calculated by using the reference values T1, T2 and T3 and the rotation pulse value of a driving motor for driving the substrate transfer robot R. As described above, only the first sensing portions 10 is used to detect the rotational movement of the end effector E. On the other hand, only the second sensing portion 20 may be used to detect the rotational movement of the end effector E.

In order to detect the misalignment in a rotational direction of the end effector E, the first illumination light emitted from the first sensing portion 10 or the second illumination light emitted from the second sensing portion 20 may pass through the movement path along which the end effector E moves rotationally such that the first sensing portion 10 or the second sensing portion 20 accurately detects the first seating portion E1 and the second seating portion E2 while the end effector moves rotationally.

Therefore, as shown in FIGS. 9 and 10, according to the substrate transfer apparatus according to an embodiment of the present invention, the end effector E is positioned at a reference position and then aligned in the correct position such that there is no sagging and misalignment. Then, while the end effector moves rotationally, the first sensing portion 10 and the second sensing portion 20 are provided such that the light emitting portions 11 and 21 and the light receiving portions 12 and 22 are disposed at different heights so as to intersect with each other on the path along which the end effector E moves rotationally. Thus, it is possible to measure the ON/OFF states of the first sensing signal or the second sensing signal that is applied to the control unit 30.

Therefore, by using the ON/OFF states of the first sensing signal or the second sensing signal applied to the control unit 30, the reference values T1, T2, and T3 and the reference distance, which serve as references for determining whether the end effector E is misaligned in a rotational direction during rotational movement of the end effector E, can be accurately measured and stored in the reference signal storage unit 31.

Figure 11:
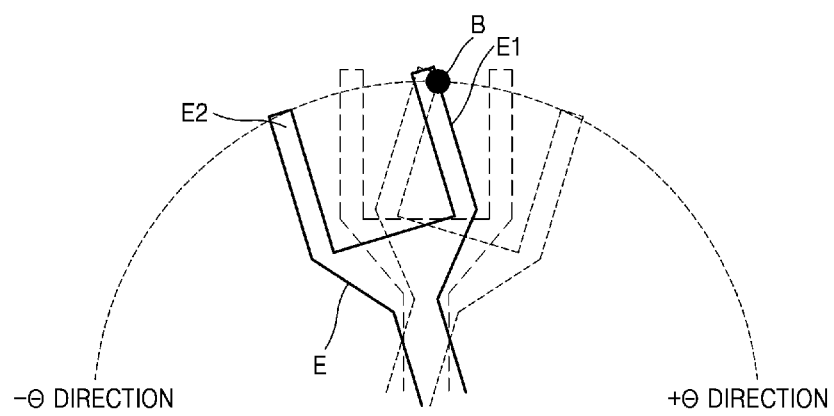
FIG. 11 is a schematic view illustrating a process of detecting the misalignment in a rotational direction of an end effector of a substrate transfer apparatus according to another embodiment of the present invention.
Figure 12:
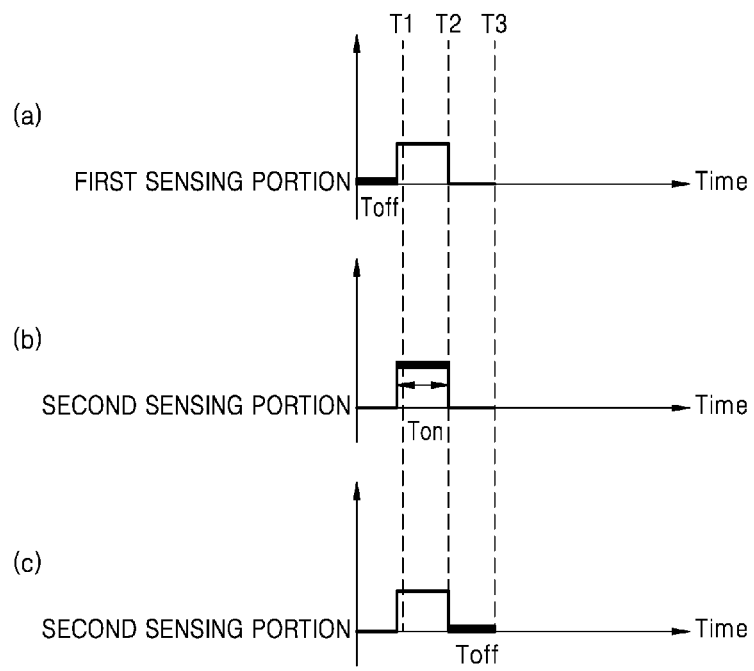
FIG. 12 is a graph showing a sensing signal that is input to a control unit in the process of detecting misalignment in the rotational direction of the end effector of the substrate transfer apparatus of FIG. 11.

FIG. 11 is a schematic view illustrating a process of detecting the misalignment in a rotational direction of an end effector of a substrate transfer apparatus according to another embodiment of the present invention. FIG. 12 is a graph showing a sensing signal that is input to a control unit in the process of detecting misalignment in the rotational direction of the end effector of the substrate transfer apparatus of FIG. 11.

As shown in FIG. 11, if the end effector E is misaligned in a counterclockwise direction, when the end effector E movers rotationally in a clockwise direction from the reference position, the first sensing signal may be applied to the control unit 30 while the OFF state of the first sensing signal is shorter than a first reference value T1, as shown in (a) of FIG. 12. Meanwhile, the ON state of the first sensing signal may be shorter than a second reference value T2, as shown in (b) of FIG. 12. Accordingly, as shown in (c) of FIG. 12, the OFF state of the first sensing signal may be maintained longer than the normal value up to a third reference value T3. On the other hand, if the end effector E is misaligned in a clockwise direction, the ON/OFF states of the first sensing signal may have a pattern opposite to the above described ON/OFF state of the first sensing signal and be applied to the control unit 30.

Therefore, as shown in FIGS. 11 and 12, according to a substrate transfer robot according to another embodiment of the present invention, when the end effector E moves rotationally from the reference position, it is possible to accurately determine whether the end effector E is misaligned in a rotational direction and the amount of misalignment by using the ON/OFF pattern of the first sensing signal or the second sensing signal applied to the control unit 30.

Therefore, it is possible to accurately sense in real time whether the end effector E is misaligned in a rotational direction and the amount of misalignment while the substrate transfer apparatus operates, and to prevent the substrate transfer apparatus from malfunctioning, thereby preventing damage to the end effector E or the substrate. Furthermore, by sensing in real time the misalignment of the end effector E, it is possible to monitor the sagging and misalignment of the end effector E without affecting the productivity of the semiconductor manufacturing equipment even if the maintenance cycle of the semiconductor manufacturing equipment does not arrive.

Figure 13:
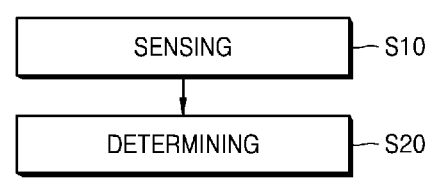
FIG. 13 is a flowchart showing a control method of a substrate transfer apparatus according to an embodiment of the present invention.

FIG. 13 is a flowchart showing a control method of a substrate transfer apparatus according to an embodiment of the present invention.

As shown in FIG. 13, the control method of a substrate transfer apparatus may include: a step S10 of sensing in which a measurement value is received from sensing portions 10 and 20 when an end effector E moves, and a step S20 of determining in which the sagging or misalignment of the end effector E is determined by a control unit 30 using the measured value by the sensing portions 10 and 20 and using predetermined reference values.

More specifically, the step S10 may include a step of sensing a first sensing signal and a step of sensing a second sensing signal. In the step of sensing a first sensing signal, the first sensing signal is received from a first sensing portion. The first sensing portion includes a first light emitting portion 11 and a first light receiving portion 12 disposed at positions corresponding to the front end portions of a first seating portion E1 and a second seating portion E2 in a diagonal direction with respect to a reference position of a substrate transfer robot R. In the step of sensing a second sensing signal, the second sensing signal is received from a second sensing portion. The second sensing portion includes a second light emitting portion 21 and a second light receiving portion 22 disposed at positions corresponding to the rear end portions of the first seating portion E1 and the second seating portion E2 so as to be parallel to the first sensing portion 10 in a diagonal direction with respect to the reference position of the substrate transfer robot R.

Furthermore, in the step S20 of determining, the control unit 30 may compare the first sensing signal sensed by the first sensing portion 10 and the second sensing signal sensed by the second sensing portion 20 with the reference value, and output an abnormality signal if the first and second sensing signals fall outside the normal range of the reference value.

For example, the control unit 30 measures the ON/OFF time of the first sensing signal and the ON/OFF time of the second sensing signal and calculates a moving time, calculates a moving distance traveled vertically by the end effector E using the moving time and the rotation pulse values of a driving motor for driving the substrate transfer robot R, and compares the moving time and the moving distance with the reference values, thereby determining whether the first seating portion E1 or second seating portion E2 of the end effector E is sagging and the amount of sagging.

Furthermore, the control unit 30 measures the ON/OFF time of the first sensing signal and the ON/OFF time of the second sensing signal and calculates a moving time, calculates a moving distance traveled rotationally by the end effector E using the moving time and the rotation pulse values of the driving motor for driving the robot R, and compares the moving time and the moving distance with the reference values, thereby determining whether the end effector is misaligned along a rotational direction and the amount of misalignment.

Therefore, according to the control method of a substrate transfer apparatus according to an embodiment of the present invention, the first sensing portion 10 or the second sensing portion 20 is provided such that the light emitting portions 11 and 21 and the light receiving portions 12 and 22 are disposed at different heights so as to intersect with each other on the path along which the end effector E moves vertically or rotationally. Thus, it is possible to measure the ON/OFF states of the first sensing signal or the second sensing signal that is applied to the control unit 30, thereby detecting the sagging in a vertical direction or misalignment in rotational direction of the end effector E.

Therefore, it is possible to accurately sense in real time whether the end effector E is sagged in a vertical direction or misaligned in a rotational direction while the substrate transfer apparatus operates, and to prevent the substrate transfer apparatus from malfunctioning, thereby preventing damage to the end effector E or the substrate. Furthermore, by sensing in real time the misalignment of the end effector E, it is possible to monitor the sagging and misalignment of the end effector E without affecting the productivity of the semiconductor manufacturing equipment even if the maintenance cycle of the semiconductor manufacturing equipment does not arrive.

While the present invention has been particularly shown and described with reference to embodiments shown in the drawings, it is only for illustrative purposes. It will be understood by those skilled in the art that various modifications and equivalent embodiments may be made. Therefore, the scope of the present invention should be determined by the technical idea of the appended claims.

The invention claimed is:

1. A substrate transfer apparatus comprising:
    a body in which a space is defined and having a gate through which a substrate passes;
    a substrate transfer robot provided inside the body and including an end effector that includes a first seating portion and a second seating portion horizontally spaced apart from each other to support and transfer the substrate;
    at least one sensing portion including a light emitting portion and a light receiving portion spaced apart from each other in a diagonal direction with respect to a longitudinal direction of the first seating portion and the second seating portion with reference to the end effector, and detecting the position of at least one of the first seating portion and the second seating portion when the end effector moves; and
    a control unit for determining whether the end effector is misaligned or sagged by using a measured value measured by the sensing portion and a predetermined reference value,
    wherein the sensing portion includes:
    a first sensing portion including a first light emitting portion and a first light receiving portion disposed at positions corresponding to front end portions of the first seating portion and the second seating portion in a diagonal direction with respect to a reference position of the substrate transfer robot; and
    a second sensing portion including a second light emitting portion and a second light receiving portion disposed at positions corresponding to rear end portions of the first seating portion and the second seating portion so as to be parallel to the first sensing portion in a diagonal direction with respect to the reference position of the substrate transfer robot,
    wherein the control unit compares a first sensing signal sensed by the first sensing portion and a second sensing signal sensed by the second sensing portion with the reference value, and outputs an abnormality signal if the first and second sensing signals fall outside a normal range of the reference value, and
    wherein, when the end effector moves up and down at the reference position, the control unit measures the ON/OFF times of the first sensing signal and the second sensing signal and calculates a moving time, calculates a moving distance traveled by the end effector by using the moving time and rotation pulse values of a driving motor for driving the substrate transfer robot, and compares the moving time and the moving distance with the reference value, thereby determining whether the first seating portion or the second seating portion is sagging and the amount of sagging.

2. A substrate transfer apparatus comprising:
a body in which a space is defined and having a gate through which a substrate passes;
a substrate transfer robot provided inside the body and including an end effector that includes a first seating portion and a second seating portion horizontally spaced apart from each other to support and transfer the substrate;
at least one sensing portion including a light emitting portion and a light receiving portion spaced apart from each other in a diagonal direction with respect to a longitudinal direction of the first seating portion and the second seating portion with reference to the end effector, and detecting the position of at least one of the first seating portion and the second seating portion when the end effector moves; and
a control unit for determining whether the end effector is misaligned or sagged by using a measured value measured by the sensing portion and a predetermined reference value,
wherein the sensing portion includes:
a first sensing portion including a first light emitting portion and a first light receiving portion disposed at positions corresponding to front end portions of the first seating portion and the second seating portion in a diagonal direction with respect to a reference position of the substrate transfer robot; and
a second sensing portion including a second light emitting portion and a second light receiving portion disposed at positions corresponding to rear end portions of the first seating portion and the second seating portion so as to be parallel to the first sensing portion in a diagonal direction with respect to the reference position of the substrate transfer robot,
wherein the control unit compares a first sensing signal sensed by the first sensing portion and a second sensing signal sensed by the second sensing portion with the reference value, and outputs an abnormality signal if the first and second sensing signals fall outside a normal range of the reference value, and
wherein, when the end effector rotates at the reference position, the control unit measures the ON/OFF times of the first sensing signal and the second sensing signal and calculates a moving time, calculates a moving distance traveled by the end effector by using the moving time and rotation pulse values of a driving motor for driving the substrate transfer robot, and compares the moving time and the moving distance with the reference value, thereby determining whether the end effector is misaligned along a rotational direction and the amount of misalignment.

3. A control method of the substrate transfer apparatus, the method comprising the steps of:
sensing in which a measurement value is received from the sensing portion when the end effector moves, and
determining in which the sagging or misalignment of the end effector is determined by the control unit by using the measured value by the sensing portion and the reference values,
wherein the step of sensing further comprises the steps of:
sensing a first sensing signal; and
sensing a second sensing signal,
wherein, in the step of sensing a first sensing signal, the first sensing signal is received from a first sensing portion, and the first sensing portion includes a first light emitting portion and a first light receiving portion disposed at positions corresponding to front end portions of the first seating portion and the second seating portion in a diagonal direction with respect to a reference position of the substrate transfer robot, and
wherein, in the step of sensing a second sensing signal, the second sensing signal is received from a second sensing portion, and the second sensing portion includes a second light emitting portion and a second light receiving portion disposed at positions corresponding to rear end portions of the first seating portion and the second seating portion so as to be parallel to the first sensing portion in a diagonal direction with respect to the reference position of the substrate transfer robot, and
wherein, in the step of determining, the control unit measures the ON/OFF time of the first sensing signal and the ON/OFF time of the second sensing signal and calculates a moving time, calculates a moving distance traveled up and down by the end effector by using the moving time and rotation pulse values of a driving motor for driving the substrate transfer robot, and compares the moving time and the moving distance with the reference value, thereby determining whether the first seating portion or the second seating portion of the end effector is sagging and the amount of sagging.

4. The method of claim 3,
wherein, in the step of determining, the control unit compares the first sensing signal sensed by the first sensing portion and the second sensing signal sensed by the second sensing portion with the reference value, and outputs an abnormality signal if the first and second sensing signals fall outside a normal range of the reference value.

5. A control method of the substrate transfer apparatus, the method comprising the steps of:
sensing in which a measurement value is received from the sensing portion when the end effector moves, and
determining in which the sagging or misalignment of the end effector is determined by the control unit by using the measured value by the sensing portion and the reference values wherein the step of sensing further comprises the steps of:
sensing a first sensing signal; and
sensing a second sensing signal,
wherein, in the step of sensing a first sensing signal, the first sensing signal is received from a first sensing portion, and the first sensing portion includes a first light emitting portion and a first light receiving portion disposed at positions corresponding to front end portions of the first seating portion and the second seating portion in a diagonal direction with respect to a reference position of the substrate transfer robot, and
wherein, in the step of sensing a second sensing signal, the second sensing signal is received from a second sensing portion, and the second sensing portion includes a second light emitting portion and a second light receiving portion disposed at positions corresponding to rear end portions of the first seating portion and the second seating portion so as to be parallel to the first sensing portion in a diagonal direction with respect to the reference position of the substrate transfer robot, and
wherein, in the step of determining, the control unit measures the ON/OFF time of the first sensing signal and the ON/OFF time of the second sensing signal and calculates a moving time, calculates a moving distance traveled rotationally by the end effector by using the moving time and rotation pulse values of a driving motor for driving the robot R, and compares the moving time and the moving distance with the reference value, thereby determining whether the end effector is misaligned along a rotational direction and the amount of misalignment.

\* \* \* \* \*